United States Patent [19]

Shimizu

[11] Patent Number: 4,688,194

[45] Date of Patent: Aug. 18, 1987

[54] MULTI-RANGE CONTROLLER

[75] Inventor: Osamu Shimizu, Tokyo, Japan

[73] Assignee: Ohkura Electric Co., Ltd., Tokyo, Japan

[21] Appl. No.: 664,758

[22] Filed: Oct. 25, 1984

[30] Foreign Application Priority Data

Nov. 18, 1983 [JP] Japan .................................. 58-218550

[51] Int. Cl.⁴ ............................................ G06F 15/20
[52] U.S. Cl. .................................... 364/571; 364/481
[58] Field of Search ............... 364/550, 551, 571, 574, 364/481; 375/98, 11, 12

[56] References Cited

U.S. PATENT DOCUMENTS

| | | | |
|---|---|---|---|
| 4,414,638 | 11/1983 | Talambiras | 364/571 |
| 4,418,392 | 11/1983 | Hata | 364/571 |
| 4,473,797 | 9/1984 | Shiota | 364/571 X |
| 4,494,212 | 1/1985 | Muellner | 374/571 |

Primary Examiner—Errol A. Krass
Assistant Examiner—H. R. Herndon
Attorney, Agent, or Firm—Kenyon & Kenyon

[57] ABSTRACT

Upon selection of a range, an input signal is amplified by a factor suitable for the range, and effects of drift and offset of the amplification are eliminated by correction based on zero-volt and a reference voltage.

1 Claim, 3 Drawing Figures

MULTI-RANGE CONTROLLER

BACKGROUND OF THE INVENTION

1. Field of the Invention

This invention relates to a controller, and more particularly to a multi-range controller, such as a multi-range temperature controller, having a plurality of ranges with different scales and an input switch selectively connecting a preselected input signal and reference signals.

2. Description of the Prior Art

Referring to FIG. 1, a typical controller of the prior art has an amplifier 1 for amplifying an input signal, an analog-digital (to be referred to as A-D hereinafter) converter 2 for converting the thus amplified input signal into a digital signal, and a control unit 3 processing the digital signal so as to deliver a control signal at an output 4. The control unit 3 of the controller of the prior art has only one range of measurement or only one scale. Since different kinds of detectors with different scales are required for different applications, a wide variety of single-range controllers have been produced and used.

From the standpoint of manufacturers, the use of a wide variety of single-range controllers results in a disadvantage of non-availability of mass production, so that the production cost tends to be high and the delivery time tends to be long against the desire of end users for low cost and short delivery time.

On the other hand, from the standpoint of users, when a different range or scale becomes desirable due to change in operating conditions or the like, remodelling of the currently used controller or purchase of a new controller is necessary. Such remodelling and purchase result in a disadvantage of causing extra waiting time and extra expenditure.

SUMMARY OF THE INVENTION

Therefore, an object of the present invention is to obviate the above-mentioned disadvantages of the prior art by providing an improved multi-range controller.

To fulfil the object, a multi-range controller according to the present invention has a range-selection switch and a plurality of ranges or scales to be selected by the range-selection switch, so that one controller of the invention can be used in various different applications while selecting the most suitable range for each specific application.

Another object of the invention is to provide a multi-range controller which is easy to use. To this end, analog amplifier with a programmable gain is provided in the controller, so as to eliminate the need of gain adjustment at each scale change and to expand the overall span of range and/or scale selection. Besides, a means for automatic calibration for the zero point and the span of the analog amplifier is provided in the multi-range controller, so as to automatically compensate for fluctuation in the gain and drift of the analog circuit. Whereby, the need of manual calibration of the zero point and the span at each switching of the range and/or scale is eliminated altogether.

A preferred embodiment of the multi-range controller according to the present invention uses an input switch which is adapted to select one of three signals, namely, an input signal I from outside circuit such as an outside detector or sensor, a zero-volt signal, and a reference voltage signal Es. An amplifier is connected to the output side of the input switch, and an A-D converter is connected to the output side of the amplifier. As a feature of the invention, a range-selection switch is provided in the controller, so as to select one of several available ranges, such as measuring ranges. To use the analog amplifier effectively, an amplification modifier is related to it, so as to automatically modify the amplification factor of said amplifier as described hereinafter.

A control unti is connected to the input switch, the analog-digial converter, the range-selection switch, and the amplification modifier. The control unit has a means to vary the amplification factor through the amplification modifier depending on the range selected by the range-selection switch and another means to compensate the input signal for the offset and drift of the analog amplifier for both zero and full-scale inputs, so as to produce a corrected input signal Ei. Thus, the corrected input signal Ei to the control unit is free from errors due to drift of the amplifier between the input switch and the A-D converter.

The corrected input signal Ei can be a product of the reference voltage Es and a ratio of a difference between two outputs of the A-D converter, namely one $D_I$ for the input signal I and one $D_o$ for the zero-volt, to another difference between two outputs of the A-D converter, namely one $D_s$ for said reference voltage Es and the one $D_o$ for the zero-volt, $Ei = Es(D_I - D_o)/(D_s - D_o)$.

Further, the controller of the invention may include a setter of set point value, so that the controller may produce a control signal based on the deviation of the corrected input signal relative to the set point value.

BRIEF DESCRIPTION OF THE DRAWINGS

For a better understanding of the invention, reference is made to the accompanying drawings, in which.

Like parts are designated by like numerals and symbols throughout different views of the drawings.

DESCRIPTION OF THE PREFERRED EMBODIMENT

Figure 1:
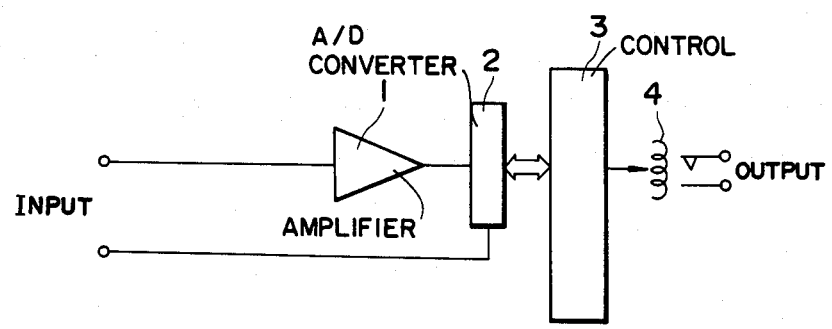
FIG. 1 is a schematic block diagram of a controller of the prior art, which controller has an output portion formed of an on-off switch.
Figure 2:
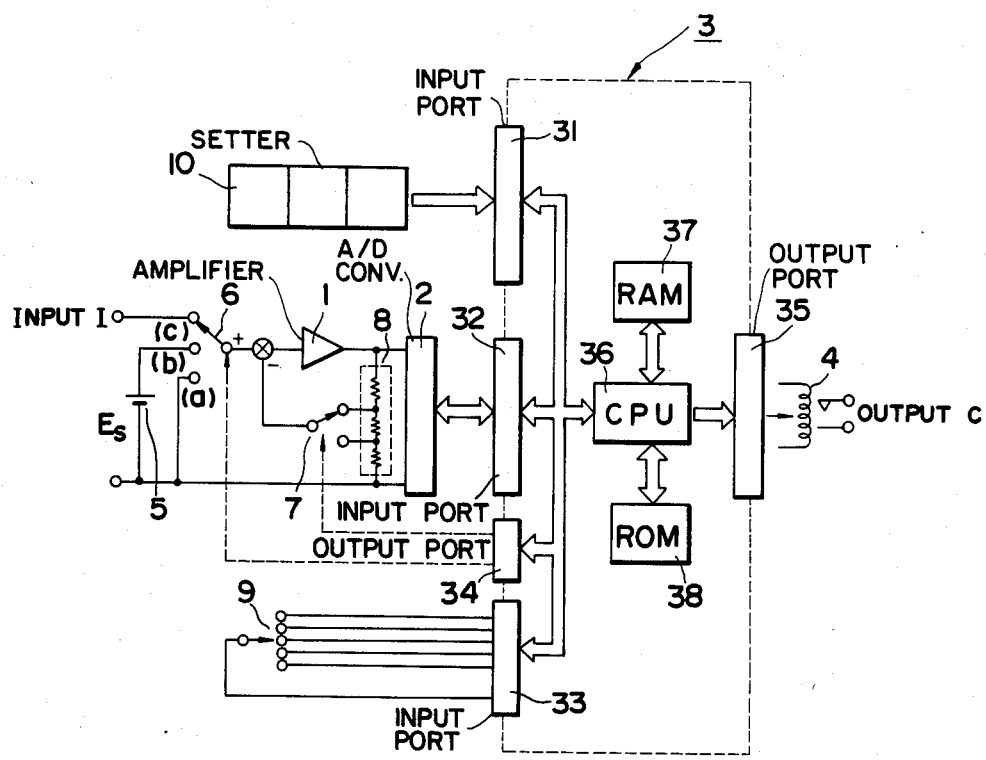
FIG. 2 is a schematic diagram of a multi-range controller according to the present invention.

The invention will be described in further detail now, by referring to FIG. 2 showing a block diagram of a preferred embodiment thereof. In the figure, an analog amplifier 1 amplifies an input signal I to a level suitable for an A-D converter 2. The digital output from the A-D converter 2 is applied to a control unit 3 having a central processing unit unit (CPU) 36 for processing the digitized input signal. The control unit 3 carries out computations necessary for desired automatic control, such as PID control, programmed control, and the like, so as to deliver a control signal C to outside circuit, such as a final control element, through an output portion 4. In the illustrated embodiment, the output portion 4 is a relay, and the output signal C is an on-off signal therefrom.

A reference voltage source 5 delivers a reference voltage Es to an input switch 6. The input switch 6 selectively applies a zero-volt signal, the reference voltage Es, or an input signal I from the outside to the analog amplifier 1, so as to facilitate compensation for offsets and/or drifts in the amplifier 1 in a manner to be described hereinafter. A gain-control switch 7 selects one of the feedback terminals of a resistance network 8, so as to vary the gain of the analog amplifier 1.

A range-selection switch 9 selects one of a number of ranges of the multi-range controller, possibly together with the corresponding scales, depending on the kind and magnitude of the input signal I. A setter 10 for setting a set point value of the quantity to be controlled, such as temperature, may be provided and connected to the control unit 3.

The control unit 3 has a first input port 31 connected to the setter 10, a second input port 32 connected to the A-D converter 2, a third input port 33 connected to the range-selection switch 9, a first output port 34 connected to both the input switch 6 and the gain-control switch 7, a second output port 35 connected to the output portion 4, and a CPU 36 having a RAM 37 and a ROM 38 connected thereto. The RAM 37 provides memories for input data, temporary storage, and the like, while the ROM 38 may carry certain programs, softwares, constants, data, and the like.

In addition to the above-mentioned computation for control, the control unit 3 fulfills the function of controlling the input switch 6, the function of monitoring the output from the range-selection switch 9, the function of monitoring the set point value set by the switch 10, and the function of controlling the gain-control switch 7 depending on the range selected by the switch 9.

Figure 3:
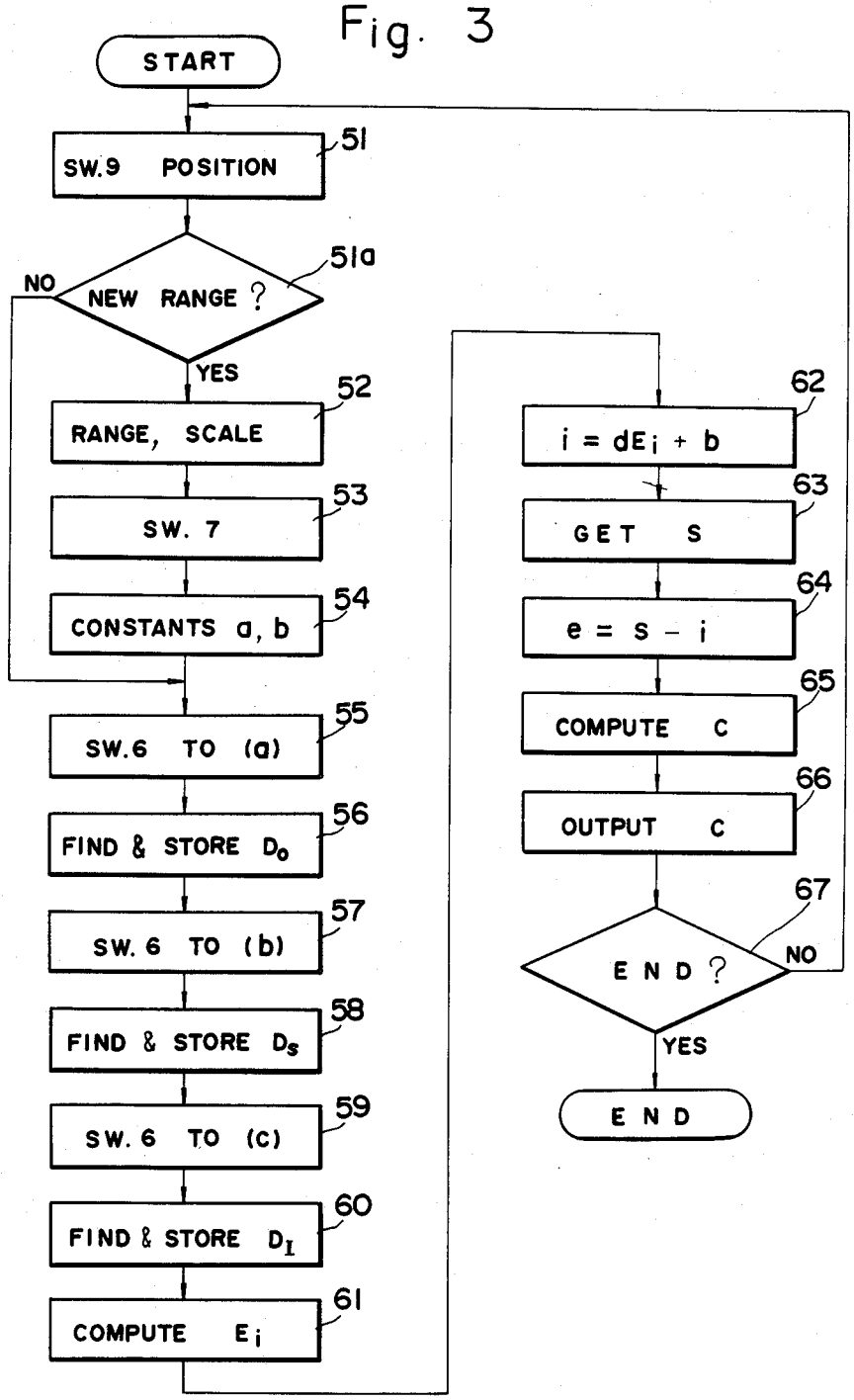
FIG. 3 is a flow chart of the operation of the controller of FIG. 2.

The operation of the multi-range controller will be described now by referring to the flow chart of FIG. 3. When the multi-range controller is connected to a power source and started, the control unit 3 checks the position of the range-selection switch 9 in the step 51, and determines whether the checked position is new or not in the logic step 51a. When the checked position of the range-selection switch 9 is new, the range with which the controller operates is ascertained in the step 52. On the other hand, if the checked position of the range-selection switch 9 is not new and the same as that of the preceding operation, the operation jumps to the step 55. The relationship between the operative positions of the range-selection switch 9 and the ranges and/or scales selected by the switch 9 is stored in the ROM 38 of the control unit 3.

Then, the control unit 3 acts on the gain-control switch 7 in the step 53, so as to make the gain of the analog amplifier 1 assume that value which is determined by the selected scale. This gain control is to prevent the converted signal of the A-D converter from saturating in the newly selected range or, on the contrary, falling into only a small part thereof. In other words, the operation of the gain-control switch 7 ensures that both the zero point and the full span of the selected scale fall in the linear range of the A-D converter 2, so as to prevent the net resolution from being degraded.

For further scaling of the input signal I for the computation, scaling constants a and b to be described hereinafter are assigned in the step 54.

As a feature of the invention, correction for the offsets and drifts of the A-D converter 2 is automatically effected, for instance, in the following manner. The input switch 6 is turned to the position (a) of FIG. 2 in the step 55, so as to determine and store the output $D_o$ of the A-D converter 2 for the zero-volt input in the step 56. The output $D_s$ of the A-D converter 2 for the reference voltage Es is determined and stored by turning the input switch 6 to the position (b) of FIG. 2 in the steps 57 and 58. The input switch 6 is further tuned to the position (c) of FIG. 2 in the step 59, and the output $D_I$ of the A-D converter 2 for the input signal I is determined and stored in the step 60. The corrected input signal Ei is determined from the reference voltage Es and the thus stored A-D converter outputs by the following equation (1) in the step 61.

$$Ei = Es(D_I - D_o)/(D_s - D_o) \qquad (1)$$

here,
Ei: corrected input signal,
Es: reference voltage,
$D_o$: A-D converter output for zero-volt input,
$D_I$: A-D converter output for input signal I, and
$D_s$: A-D converter output for reference voltage Es.

As can be seen from the equation (1), the corrected input signal Ei is free from the effects of any offsets, drifts, and the gain of the analog amplifier 1. The corrected input signal Ei is converted to a suitable value i for computation and display as shown in the step 62, and it may be displayed at the multi-range controller.

Based on the thus determined value of the input signal, the control unit 3 carries out the computation for the desired control, such as the PID control, the control of output signals, and the related displays, by means of the microcomputer software stored in the ROM 38 or the RAM 37. Although such computation belongs to the prior art, a case of on-off control will be described hereunder as an example.

The set point value S is retrieved in the step 63, and the deviation e between the scaled input signal i and the set point value S is determined in the step 64. Certain computations are carried out so as to determine a control signal C from the above deviation in the step 65. The control signal C thus determined is sent out to the outside circuit, such as a final control element, through the second output port 35 as an output from the muti-range controller in the step 66. In the illustrated example, the control signal C is an on-off signal produced by the relay circuit of the output portion 4. However, the invention is not restricted to such on-off control operation. In the logic step 67, if further control operation is required, the operation returns to the step 51. On the other hand, if termination is required, the operation comes to end.

In the illustrated embodiment, the switching of ranges is effected by a mechanical range-selection switch 9. However, the invention is not restricted to such mechanical switch, and for instance, a desired range may be specified and stored in the memory of the controller by using a suitable key arrangement. Similar modifications may be applied to the setter 10 of the set point value.

The calibration for the zero point and the span of the analog amplifier 1 may be effected each time the input signal I is read. However, in view of the fact that the offsets and drifts in linear integrated circuits (IC) of the analog amplifiers 1 do not vary so frequently, that calibration may be made at certain intervals, such as in every several minutes or in every several tens of minutes.

The above-mentioned calibration for the zero point and the span of the analog amplifier 1 is independent from the zero point and the span of multi-range controller. For instance, one calibration of the amplifier 1 may be sufficient for two controller scales 0–1000° C. and 500–1000° C.

As described in the foregoing, in a multi-range controller according to the present invention, the desired range or scale can be freely selected simply by turning the range-selection switch, and the built-in function of automatic calibration for the zero point and the span of the amplifier eliminates the need of range and/or scale calibration each time it is changed. Thus, the multi-range controller of the invention is very easy to use.

It should be noted here that the built-in automatic calibration function for the zero point and the span of the analog amplifier eliminates the adverse effects of offset voltages and drifts in such amplifier, so that amplifiers made of inexpensive linear integrated circuits can be used in the multi-range controller without sacrificing any performance characteristics of the controller. Thus, the invention facilitates a considerable saving in the cost of such multi-range controllers.

What is claimed is:

1. A multi range controller comprising:

an amplifier having an input switch, said input switch selectively connecting an input signal I, ground, and a reference voltage Es to an input of the amplifier one at a time, said amplifier generating output signals $D_I$, $D_o$, and $D_s$ corresponding to said input signals I, ground and reference voltage $E_s$, respectively;

an analog-to-digital (A-D) converter connected to an output of said amplifier;

a range-selection switch having a plurality of switch positions for selecting different measurement ranges respectively, so as to designate a selected range by setting the range-selection switch to a switch position which corresponds to said selected range;

an amplification controller coupled to said amplifier and connected to said range-selection switch, said amplification controller modifying an amplification factor of said amplifier depending of said selected range; and a control unit having a memory and being connected to said input switch, said control unit further having a drift-compensation means for actuating, in response to the input signal I, said input switch for connecting the input of the amplifier sequentially to the input signal I, ground, and the reference voltage Es, said control unit storing the corresponding amplifier outputs $D_I$, $D_o$, and $D_s$, respectively in the memory, thereafter said drift-compensation means producing a corrected output signal Ei for the input signal I wherein $Ei = Es(D_I - D_o)/(Ds = D_o)$.

* * * * *